United States Patent
Yamamoto et al.

(10) Patent No.: US 8,097,121 B2
(45) Date of Patent: *Jan. 17, 2012

(54) PROTECTIVE TAPE SEPARATION METHOD AND PROTECTIVE TAPE SEPARATION APPARATUS

(75) Inventors: Masayuki Yamamoto, Ibaraki (JP); Saburo Miyamoto, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 157 days.

This patent is subject to a terminal disclaimer.

(21) Appl. No.: 12/207,139

(22) Filed: Sep. 9, 2008

(65) Prior Publication Data

US 2009/0065144 A1 Mar. 12, 2009

(30) Foreign Application Priority Data

Sep. 10, 2007 (JP) ................................. 2007-234151

(51) Int. Cl.
*B32B 38/10* (2006.01)
(52) U.S. Cl. ........................................ 156/702; 156/247
(58) Field of Classification Search .................. 156/344, 156/247, 702
See application file for complete search history.

(56) References Cited

U.S. PATENT DOCUMENTS

| | | | | |
|---|---|---|---|---|
| 5,891,298 A * | 4/1999 | Kuroda et al. | ................. | 156/344 |
| 2002/0173229 A1* | 11/2002 | Kobayashi | ......................... | 451/5 |
| 2006/0219359 A1* | 10/2006 | Miyamoto et al. | ............. | 156/344 |
| 2007/0119543 A1* | 5/2007 | Ametani | ........................ | 156/344 |
| 2007/0284038 A1* | 12/2007 | Yamamoto et al. | ............ | 156/297 |

FOREIGN PATENT DOCUMENTS

| | | |
|---|---|---|
| JP | 05-063077 A | 3/1993 |
| TW | 200726711 A | 7/2007 |

OTHER PUBLICATIONS

The Second Office Action for the Application No. CN 200810212314.2 from The State Intellectual Property Office of People's Republic of China dated Jun. 2, 2011.
The First Office Action for the Application No. CN 200810212314.2 from The State Intellectual Property Office of People's Republic of China dated Feb. 25, 2011.
Decision of Rejection for the Application No. 200810212314.2 from The State Intellectual Property Office of People's Republic of China dated Sep. 1, 2011.

* cited by examiner

*Primary Examiner* — Khanh P Nguyen
*Assistant Examiner* — John Blades
(74) *Attorney, Agent, or Firm* — Cheng Law Group, PLLC

(57) ABSTRACT

A surface height of a protective tape joined to a wafer mounted and held on a separation table is detected, an operation amount of approaching a joining member to the protective tape until a separation tape wound around the joining member contacts the protective tape based on detected information, the joining member is operation controlled to approach the protective tape based on the calculated operation amount, the joining member and the separation table are relatively moved along a direction of a surface of the protective tape in a state of maintaining the height of the joining member to join the separation tape to the protective tape, and the separation tape is separated from the surface of the wafer integrally with the protective tape.

9 Claims, 11 Drawing Sheets

PROTECTIVE TAPE SEPARATION METHOD AND PROTECTIVE TAPE SEPARATION APPARATUS

BACKGROUND OF THE INVENTION (1) Field of the Invention

The present invention relates to a protective tape separation method and a protective tape separation apparatus for joining a separation tape, which has an adhesive force stronger than that of a protective tape joined to a surface of a semiconductor wafer, to the protective tape and separating the separation tape, thereby separating the protective tape integrally with the separation tape.

(2) Description of the Related Art

A semiconductor wafer (hereinafter, simply referred to as "wafer") is thinned by processing by using a mechanical method such as grinding or polishing, or a chemical method using etching. At the time of processing the wafer by using any of the methods, a protective tape is joined to a surface of the wafer to protect the surface on which a wiring pattern is formed. The wafer to which the protective tape is joined and which is grinded is adhered and held from a back side thereof to a ring frame by way of a dicing tape. The protective tape is then separated from the surface of the wafer held by the ring frame.

A method for joining the separation tape to the surface of the protective tape by way of a roller-shaped joining member, and separating the separation tape to be separated and removed and then wound integrally with the protective tape from the surface of the wafer is known (see e.g., Japanese Laid-Open Patent Publication No. 05-63077) as a method for separating the protective tape.

The above-mentioned conventional protective tape separation method, however, has the following problems.

In recent years, with rapid progress in applications, reduction in thickness of a wafer is in demand and a wafer is thinned to 150 µm or less to enable high density packaging. Thus, the wafer may be damaged by the pressing force of the joining member when joining the separation tape to the surface of the protective tape by way of the roller-shaped joining member.

SUMMARY OF THE INVENTION

It is a main object of the present invention to provide a protective tape separation method and a protective tape separation apparatus capable of joining a separation tape to a protective tape joined to the surface of the semiconductor wafer without damaging the semiconductor wafer, and separating the separation tape, thereby separating the protective tape integrally with the separation tape from the semiconductor wafer at high accuracy.

The inventors of the present invention have found, as a result of thoroughly reviewing the causes of cracks in the wafer by repeating the process of joining the separation tape, that cracks are caused by the variation in thickness of the protective tape joined to the surface of the wafer and/or the dicing tape (adhesive tape) which holds the wafer on the ring frame. In other words, the change in elasticity of an adhesive layer differs depending on the change in the pressing force when joining the protective tape to the surface of the wafer. Similar situation occurs when joining the dicing tape.

Therefore, the planarity of the surface of the protective tape, which the outermost surface, cannot be maintained as the total thickness of the dicing tape, the wafer, and the protective tape partially changes. Such microscopic variation in surface height causes variation in the pressing force when joining the separation tape, and damages the wafer.

In order to achieve the above object, the invention employs the following configuration.

A protective tape separation method for separating a protective tape from a surface of a semiconductor wafer integrally with a separation tape by joining the separation tape to the protective tape joined to the surface of the semiconductor wafer while pressing a non-adhesion surface side by a joining member and separating the separation tape, the method including a detecting step of detecting a separation tape joining start position and a surface height of the protective tape joined to the semiconductor wafer mounted and held on a separation table; a calculating step of calculating an operation amount of approaching the joining member to the protective tape until the separation tape wound around the joining member contacts the protective tape based on the detected information of the surface height of the protective tape; a separation tape joining start step of controlling the operation to approach the joining member to the protective tape based on the calculated operation amount, and joining the separation tape to the protective tape; a separation tape joining step of relatively moving the joining member and the separation table along a direction of a surface of the protective tape while maintaining the height of the joining member based on the operation amount and joining the separation tape to the protective tape; and a tape separating step of separating the separation tape from the surface of the semiconductor wafer integrally with the protective tape.

According to the protective tape separation method of the present invention, the operation amount to approach the joining member to the protective tape is calculated by detecting the surface height of the protective tape. This operation amount is calculated as a value obtained by subtracting the acquired surface height of the protective tape and the thickness of the separation tape wound around the joining member from the height of the joining member at the origin position or the standby position. The operation amount for contacting the separation tape to the surface of the protective tape by the joining member is calculated in such a manner.

The joining member at the original height position is controlled to approach the protective tape based on the calculated operation amount, and then stopped. The separation tape is then contacted to the surface of the protective tape with a predetermined pressing force. When the separation tape is contacted to the surface of the protective tape, the joining member and the separation table are relatively moved along the direction of the surface of the protective tape based on the calculated surface height of the protective tape, thereby the separation tape is joined to the surface of the protective tape.

The joined separation tape is then separated, so that the protective tape joined with the separation tape is separated from the surface of the semiconductor wafer integrally with the separation tape.

As a result, the separation tape can be joined to the protective tape without applying excessive load on the semiconductor wafer, and the protective tape and the separation tape can be reliably and smoothly separated from the semiconductor wafer in an integrated manner.

In the above method, the calculating step preferably has an average value of a plurality of detected values as the surface height of the protective tape, the plurality of detected values being obtained in the detecting step in a predetermined range including a wafer edge on a side to start joining of the separation tape of the semiconductor wafer.

According to this method, the separation tape can be accurately joined to the surface of the protective tape when starting to join the separation tape. Therefore, the subsequent separation of the protective tape from the surface of the wafer involved in the separation of the separation tape becomes more accurate.

The average value obtained in the calculating step of the method is preferably obtained by measuring a distribution of the surface height from the detected value, and excluding a unique value from the distribution.

According to this method, unique values can be excluded from the distribution of the surface height, and the average value of the surface height takes a more even value. The unique values referred to herein include those from concave parts caused by deficit etc. of the protective tape, raised portions due to chipping of the protective tape, attachment of foreign substances, and the like. Excessive load is not applied on the wafer with the joining member by excluding these unique values. As a result, the damages to the wafer can be avoided.

A deviation between a reference value of the surface height of the protective tape determined in advance and an actual measurement value of the surface height of the protective tape obtained from an actual measurement is obtained, and the operation amount obtained in the calculating step of the method is corrected according to the deviation.

According to this method, the excessive load is avoided from being applied on the wafer since the operation amount of the joining member is corrected according to the deviation obtained from the reference value and the actual measurement value.

Preferably, in the method, the separation tape is joined to an end of the protective tape on the side to start joining of the separation tape, and the separation tape is joined from the end towards a side to terminate joining of the separation tape.

According to this method, the protective tape can be separated from the surface of the wafer with one joining operation of the separation tape.

Preferably, in the method, the joining member is operated to approach the surface of the protective tape closer to a center of the wafer with respect to the wafer edge on the side to start joining of the separation tape, and join the separation tape towards the wafer edge on the side to start joining of the separation tape while maintaining a height of the joining member; and the separation tape is then joined towards a wafer edge on a side to terminate joining of the separation tape while maintaining the height of the joining member.

According to this method, the site closer to the center of the wafer with respect to the wafer edge has rigidity higher than that of the wafer edge, and thus by having such a site as the position to start joining the separation tape, it becomes effective in avoiding the semiconductor wafer from being damaged by the first joining pressing force by the joining member.

The method further preferably includes a step of arranging a joining prevention member having a difficult-to-adhere property for receiving the separation tape running out from the wafer edge on an outer side of the wafer edge on the side to start joining of the separation tape before the step of starting joining of the separation tape.

According to this method, in the process of joining the separation tape joined from the site on the center side of the wafer with respect to the wafer edge up to the wafer edge on the side to start joining of the separation tape, the portion that runs out can be received by the joining prevention member even if the separation tape portion floating from the joining member runs out to the outer side of the wafer edge. Therefore, the portion that runs out of the separation tape is prevented in advance from being joined and fixed to the adhesion surface etc. of the adhesive tape other than the protective tape.

The method further includes detecting a position of the wafer edge and a height of an outer peripheral portion of the wafer edge; calculating an operation amount of approaching a distal end of the joining prevention member to the surface height of the wafer edge and the outer peripheral portion of the wafer edge based on the detected information; and moving the joining prevention member to a position corresponding to the calculated operation amount before the step of starting joining of the separation tape.

According to this method, the portion that runs out of the separation tape joined to the protective tape can be reliably received by the joining prevention member.

Preferably in the method, a surface of the adhesive tape exposed between the ring frame and the semiconductor wafer is detected in the detecting step; an operation amount of approaching the joining prevention member to the adhesive tape is calculated based on the detected information in the calculating step; and a step of approaching the joining prevention member to the adhesive tape is provided before the step of starting joining of the separation tape.

According to this method, the joining prevention member is arranged at an appropriate position where the separation tape running out from the wafer edge does not contact the adhesive tape exposed between the wafer and the ring frame when joining the separation tape.

In the method, the step of joining the separation tape and the step of separating the tape are preferably simultaneously carried out.

According to this method, the joining and the separation of the separation tape are simultaneously advanced, and the protective tape is sequentially separated at high efficiency from the edge where joining of the separation tape started.

In order to achieve the above object, the invention further employs the following configuration.

A protective tape separation apparatus for separating a protective tape from a surface of a semiconductor wafer integrally with a separation tape by joining the separation tape to the protective tape joined to the surface of the semiconductor wafer with a joining member from a non-adhesion surface side and separating the separation tape, the apparatus including a separation table for mounting and holding the semiconductor wafer with the protective tape; separation tape supplying means for winding and supplying the band-shaped separation tape to the joining member; first lifting driving means for relatively moving the joining member upward and downward with respect to the separation table between an operating position of joining the separation tape to the surface of the protective tape joined to the semiconductor wafer held on the separation table and a standby position on an upper side of the operation position; horizontal driving means for relatively moving the separation table and the joining member horizontally; first controlling means for controlling each driving means to relatively move the joining member and the separation table by the horizontal driving means and simultaneously separate the separation tape and the protective tape while joining the separation tape to the protective tape; tape collecting means for collecting the protective tape integrally with the separated separation tape; a detector for detecting a position to start joining the separation tape and a surface height of the protective tape joined to the semiconductor wafer held on the separation table; calculating means for calculating an operation amount of approaching the joining member to the surface of the protective tape based on the detected information of the surface height of the protective tape; and second controlling means for operation controlling the first lifting driving means based on the calculated operation amount.

The method of the invention can be suitably implemented according to this configuration.

In the apparatus, preferably, the semiconductor wafer is held at a center of a ring frame by way of a supporting adhesive tape and the adhesive tape is exposed between the ring frame and the semiconductor wafer; the apparatus further includes a joining prevention member for receiving the separation tape arranged towards a side to start joining of the separation tape of the semiconductor wafer, and second lifting driving means for relatively moving the joining prevention member upward and downward with respect to the separation table; the detector detects a surface height of the adhesive tape exposed between the ring frame and the semiconductor wafer; the calculating means calculates the operation amount to approach the joining prevention member to the adhesive tape; and the second controlling means operation controls the second lifting driving means based on the calculated operation amount.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of a semiconductor wafer mount apparatus provided with a protective tape separation apparatus of the present invention will be described below with reference to the drawings.

Figure 1:
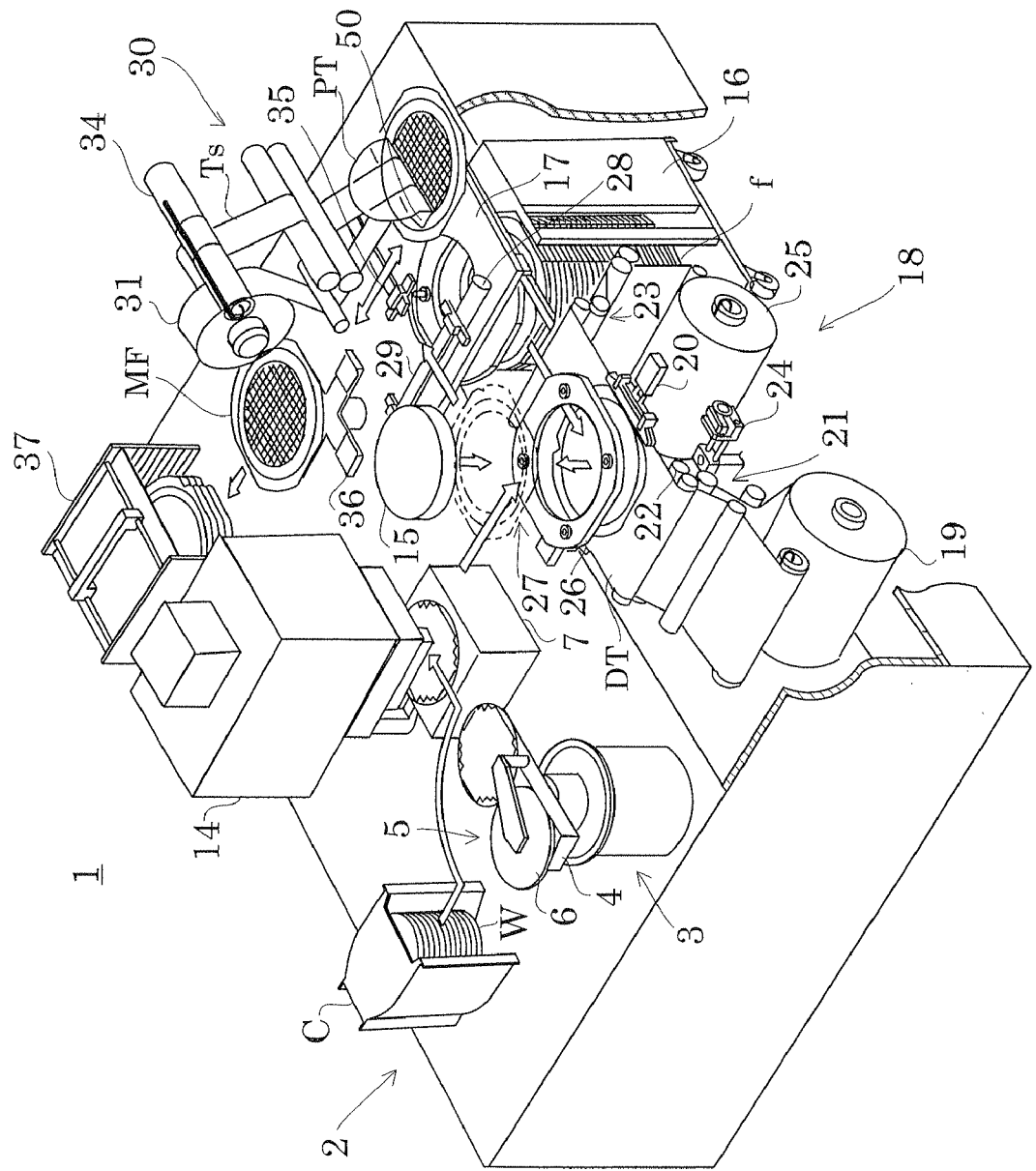
FIG. 1 is a perspective view illustrating a whole semiconductor wafer mount apparatus.

FIG. 1 is a cutaway perspective view illustrating a whole configuration of a semiconductor wafer mount apparatus according to an embodiment of the invention.

A semiconductor wafer mount apparatus 1 includes a wafer supply part 2 in which cassettes C for housing wafers W subjected to a back grinding process in multiple stages are loaded, a wafer transport mechanism 3 having a robot arm 4 and a pressing mechanism 5, an alignment stage 7 for aligning the wafer W, an ultraviolet irradiation unit 14 for emitting ultraviolet rays toward the wafer W mounted on the alignment stage 7, a chuck table 15 for suction-holding the wafer W, a ring frame supply part 16 in which ring frames f are housed in multiple stages, a ring frame transport mechanism 17 for moving to mount the ring frame f onto an adhesive tape DT functioning as a supportive dicing tape, a tape processing part 18 for joining the adhesive tape DT from the back side of the ring frame f, a ring frame lifting mechanism 26 for moving the ring frame f to which the adhesive tape DT is joined in the vertical direction, a mount frame fabrication part 27 for fabricating a mount frame MF integrated by joining the wafer W to the ring frame f to which the adhesive tape DT is joined, a first mount frame transport mechanism 29 for transporting the fabricated mount frame MF, a separation mechanism 30 for separating the protective tape PT joined to the surface of the wafer W, a second mount frame transport mechanism 35 for transporting the mount frame MF from which the protective tape PT is separated by the separation mechanism 30, a turn table 36 for turning and transporting the mount frame MF, and a mount frame collecting part 37 for housing the mount frames MF in multiple stages.

The wafer supply part 2 has a cassette stand (not shown). The cassettes C housing the wafers W, which has a protective tape PT joined to a pattern surface (hereinafter appropriately referred to as "surface"), in multiple stages is mounted on the cassette stand. The wafer W maintains a horizontal posture with its pattern surface facing upward.

The wafer transport mechanism 3 is constructed so as to swing and move in the vertical direction by a driving mechanism (not shown). Specifically, the wafer transport mechanism 3 performs position adjustment of a wafer holder of the robot arm 4 which will described later and a pressing plate 6 of the pressing mechanism 5, and transports the wafer W from the cassette C to the alignment stage 7.

The robot arm 4 of the wafer transport mechanism 3 has, at its distal end, a wafer holder (not shown) having a horseshoe shape. The robot arm 4 is constructed so that its wafer holder can move forward/rearward in the gaps between the wafers W housed in multiple stages in the cassettes C. The wafer holder at the distal end of the robot arm has a suction hole, and holds the wafer W at the distal end from the back side by vacuum.

The pressing mechanism 5 of the wafer transport mechanism 3 has, at its distal end, the circular pressing plate 6 having almost the same shape as that of the wafer W. The arm portion of the pressing mechanism 5 can move forward/rearward so that the pressing plate 6 is moved above the wafer W mounted on the alignment stage 7. The shape of the pressing plate 6 is not limited to the circular shape but may be any shape as long as a warp which occurs in the wafer W can be corrected. For example, a distal end of a stick or the like may be pressed against a warped portion of the wafer W.

The pressing mechanism 5 operates in the case where poor suction occurs when the wafer W is mounted on a holding table of the alignment stage 7 which will be described later. Concretely, when a warp occurs in the wafer W and the wafer W cannot be suction-held, the pressing plate 6 presses the surface of the wafer W and corrects the warp, so that the surface becomes flat. In this state, a holding table sucks by vacuum the back side of the wafer W.

The alignment stage 7 has a holding table for positioning the mounted wafer W on the basis of an orientation flat, a notch, or the like provided at a peripheral edge, and covering and sucking by vacuum the whole back side of the wafer W.

The alignment stage 7 detects a pressure value when the wafer W is sucked by vacuum, and compares the pressure value with a reference value which is predetermined in relation to a pressure value in normal operation (when the wafer W is normally sucked by the holding table). If the pressure value is higher than the reference value (that is, when the pressure in an intake pipe is not sufficiently lowered), determination is made that the wafer W is warped and is not sucked by the holding table. The pressing plate 6 is operated to press the wafer W and correct the warp, so that the wafer W can be sucked by the holding table.

The alignment stage 7 can transport the wafer W in a state where it suction-holds the wafer W between an initial position where the wafer W is mounted and positioned and an intermediate position between the chuck table 15 and the ring frame lifting mechanism 26 disposed in multiple stages above the tape processing part 18 which will be described later. That is, the alignment stage 7 transports the wafer W to the next process while correcting the warp of the wafer W and holding the wafer W in a flat state.

The ultraviolet irradiation unit 14 is disposed above the alignment stage 7 in the initial position. The ultraviolet irradiation unit 14 emits ultraviolet rays toward the protective tape PT as an ultraviolet curing adhesive tape joined to the surface of the wafer W. That is, the unit decreases the adhesion of the protective tape PT by the irradiation of ultraviolet rays.

The chuck table 15 has a circular shape which is almost the same as that of the wafer W so as to be able to cover and suck by vacuum the surface of the wafer W. A driving mechanism (not shown) moves the chuck table 15 vertically from a standby position above the tape processing part 18 to a position where the wafer W is joined to the ring frame f.

That is, the chuck table 15 comes into contact with the wafer W whose warp is corrected and held in a flat state by the holding table, and suction-holds the wafer W.

The chuck table 15 moves downward to a position where it is fit in an opening of the ring frame lifting mechanism 26 for suction-holding the ring frame f, to which the adhesive tape DT to be described later is joined from the back side, and the wafer W comes close to the adhesive tape DT in the center of the ring frame f.

At this time, the chuck table 15 and the ring frame lifting mechanism 26 are held by a holding mechanism (not shown).

The ring frame supply part 16 has a wagon shape having a bottom provided with wheels, and is loaded inside the semiconductor wafer mount apparatus 1. The upper part of the ring frame supply part 16 is formed with an opening in which the ring frames f interiorly housed in multiple stages are slid up and fed out from the opening.

The ring frame transport mechanism 17 sequentially sucks by vacuum the ring frames f housed in the ring frame supply part 16 from the top one by one, and transports the ring frame f in the order of the alignment stage (not shown) and a position where the adhesive tape DT is joined. The ring frame transport mechanism 17 also serves as a holding mechanism which holds the ring frame f at the position of joining the adhesive tape DT at the time of joining the adhesive tape DT.

The tape processing part 18 includes a tape supply part 19 for supplying the adhesive tape DT, a tension mechanism 20 for tensioning the adhesive tape DT, a joining unit 21 for joining the adhesive tape DT to the ring frame f, a cutter mechanism 24 for cutting the adhesive tape DT joined to the ring frame f, a separation unit 23 for separating an unnecessary tape from the ring frame f after the cutting by the cutter mechanism 24, and a tape collecting part 25 for collecting the cut unnecessary remaining tape.

The tension mechanism 20 catches both ends of the adhesive tape DT in the width direction and applies tension in the tape width direction. Specifically, when the soft adhesive tape DT is used, vertical wrinkles generate in the surface of the adhesive tape DT along the tape supply direction due to tension applied in the tape supply direction. In order to uniformly join the adhesive tape DT to the ring frame f while avoiding the vertical wrinkles, the tension mechanism 20 applies tension in the tape width direction.

The joining unit 21 is disposed in the standby position obliquely below (lower left in FIG. 1) the ring frame f held above the adhesive tape DT. In other words, a joining roller 22 provided in the joining unit 21 moves to the joining start position on the right side in the tape supply direction at the same time when the ring frame f is transported from the ring frame transport mechanism 17 and held at the position where the adhesive tape DT is joined and supply of the adhesive tape DT from the tape supply part 19 is started.

The joining roller 22 arrived at the joining start position moves upward and presses the adhesive tape DT against the ring frame f. After that, the joining roller 22 rolls from the joining start position toward the standby position and joins the adhesive tape DT to the ring frame f while pressing the adhesive tape DT.

The separation unit 23 separates an unnecessary portion of the adhesive tape DT cut by the cutter mechanism 24 which will be described later from the ring frame f. Concretely, after the adhesive tape DT is joined to the ring frame f and is cut, the holding of the adhesive tape DT by the tension mechanism 20 is released. The separation unit 23 moves toward the tape supply part 19 over the ring frame f to separate the cut unnecessary adhesive tape DT.

The cutter mechanism 24 is disposed below the adhesive tape DT on which the ring frame f is mounted. When the adhesive tape DT is joined to the ring frame f by the joining unit 21, the holding of the adhesive tape DT by the tension mechanism 20 is released, and the cutter mechanism 24 moves upward. The cutter mechanism 24 moved upward cuts the adhesive tape DT along the ring frame f.

The ring frame lifting mechanism 26 is in a standby position above the position where the adhesive tape DT is joined to the ring frame f. The ring frame lifting mechanism 26 moves downward when the process of joining the adhesive tape DP to the ring frame f is finished, and suction-holds the ring frame f. At this time, the ring frame transport mechanism 17 that has held the ring frame f returns to the initial position above the ring frame supply part 16.

The ring frame lifting mechanism 26 suction-holds the ring frame f and moves upward to the position where the wafer W is joined to the ring frame f. At this time, the chuck table 15 that suction-holds the wafer W moves downward to the position where the wafer W is joined to the ring frame f.

The mount frame fabrication part 27 includes a joining roller 28 whose circumferential surface is elastically deformable. The joining roller 28 rolls while pressing a non-adhesion surface of the adhesive tape DT joined to the back side of the ring frame f.

The first mount frame transport mechanism 29 sucks by vacuum a mount frame MF formed by integrating the ring frame f and the wafer W, and transfers the mount frame MF to a separation table 38 of the separation mechanism 30.

Figure 2:
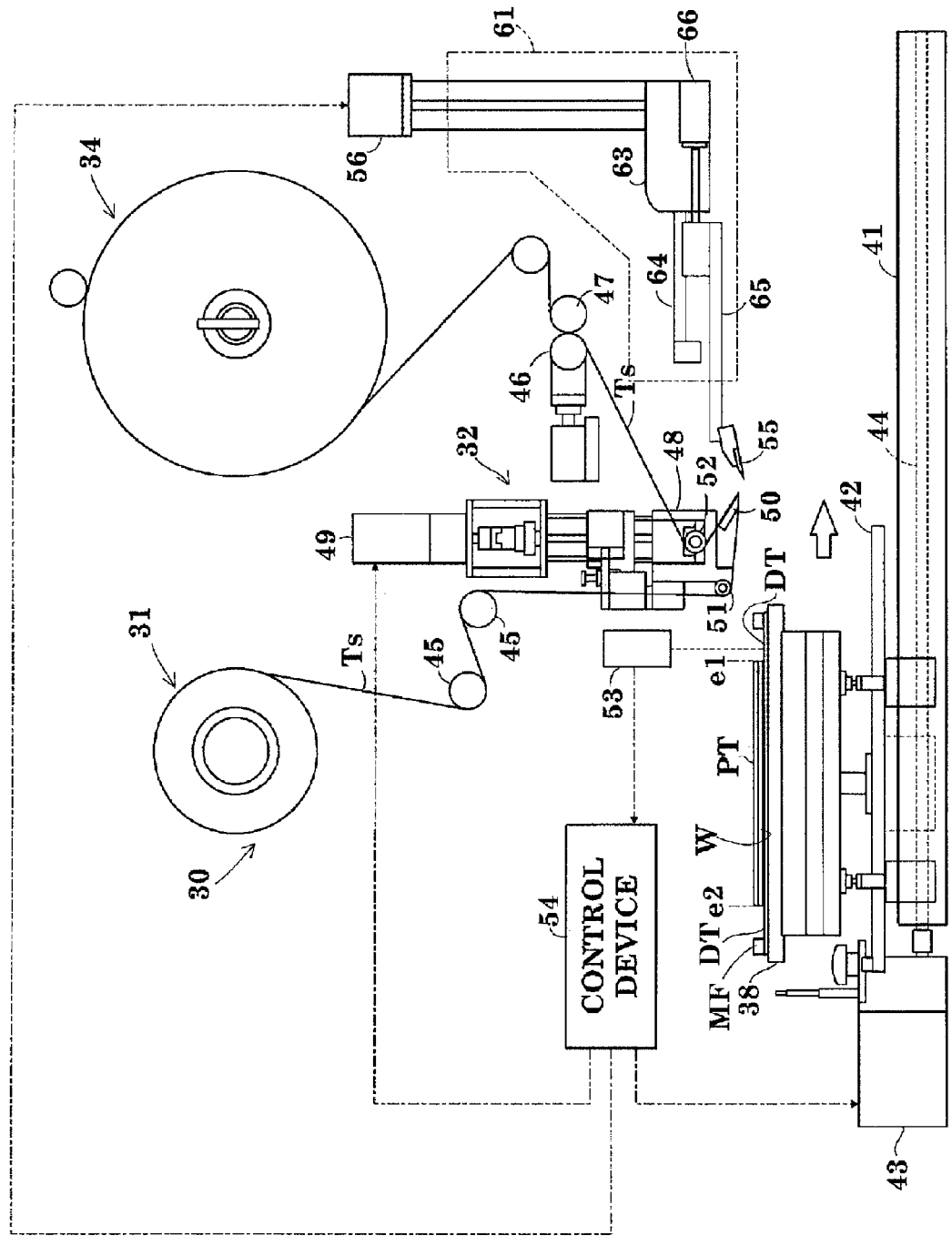
FIG. 2 is a side view illustrating a separation mechanism.
Figure 3:
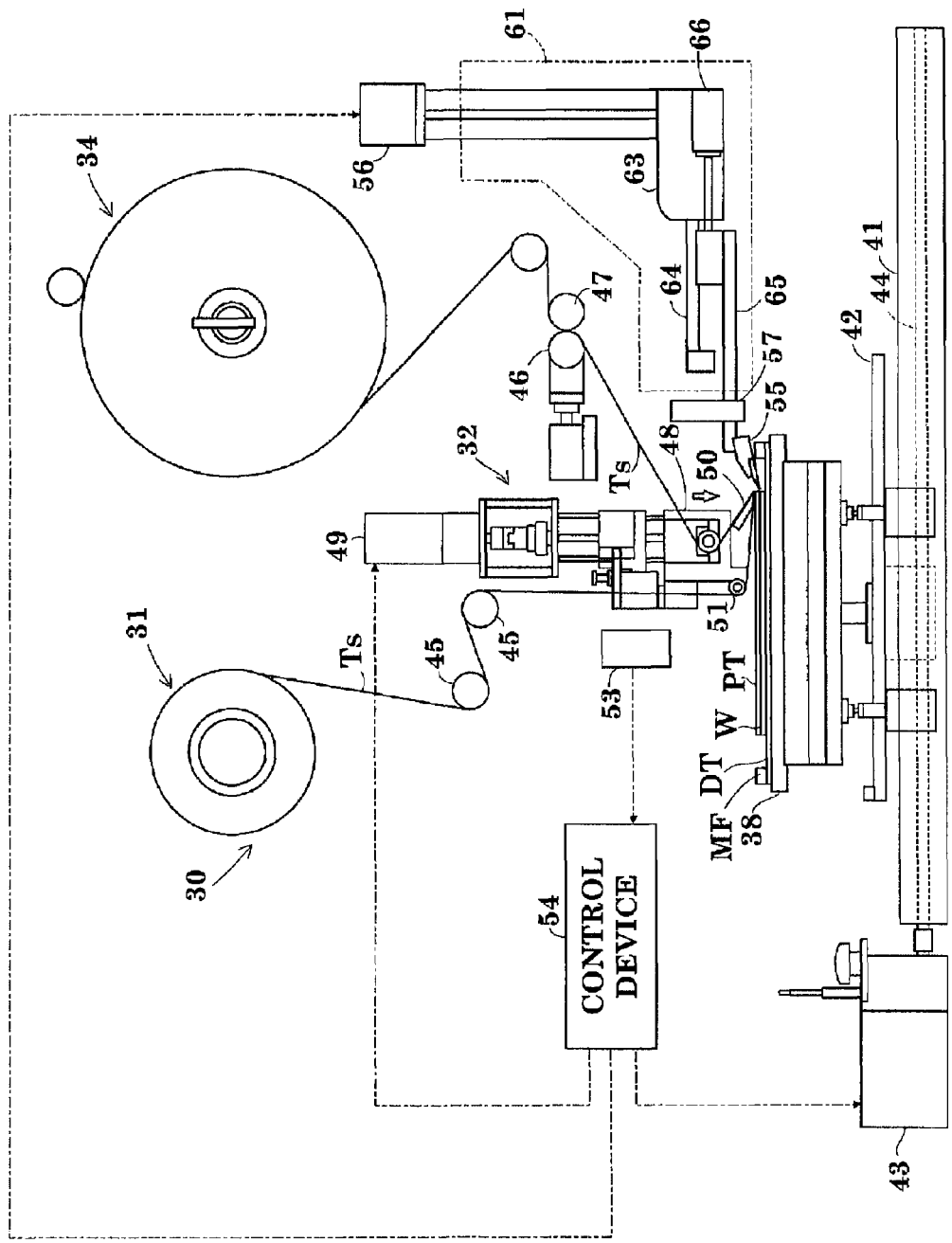
FIG. 3 is a side view illustrating the operation process of the separation mechanism.
Figure 4:
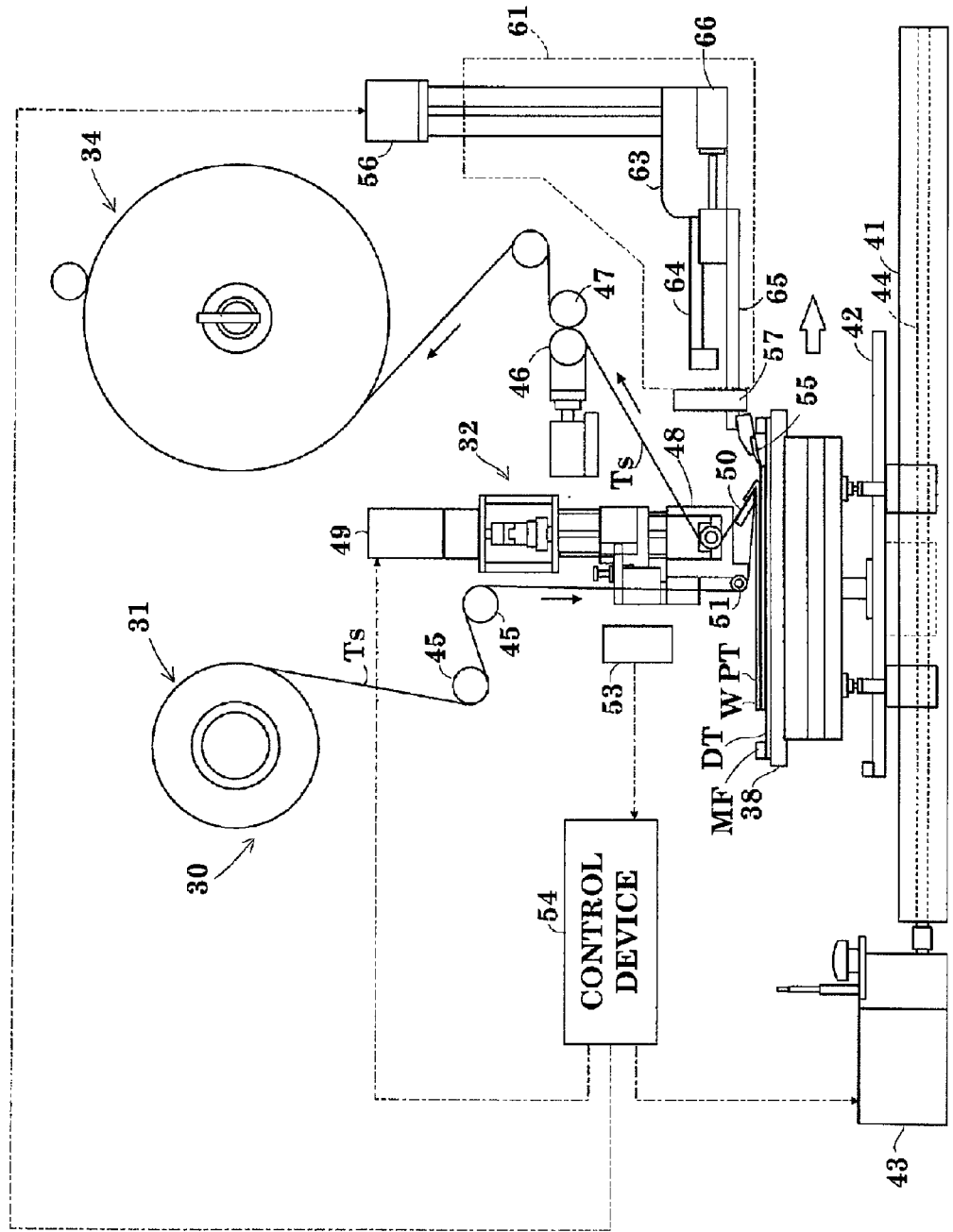
FIG. 4 is a side view illustrating the operation process of the separation mechanism.
Figure 5:
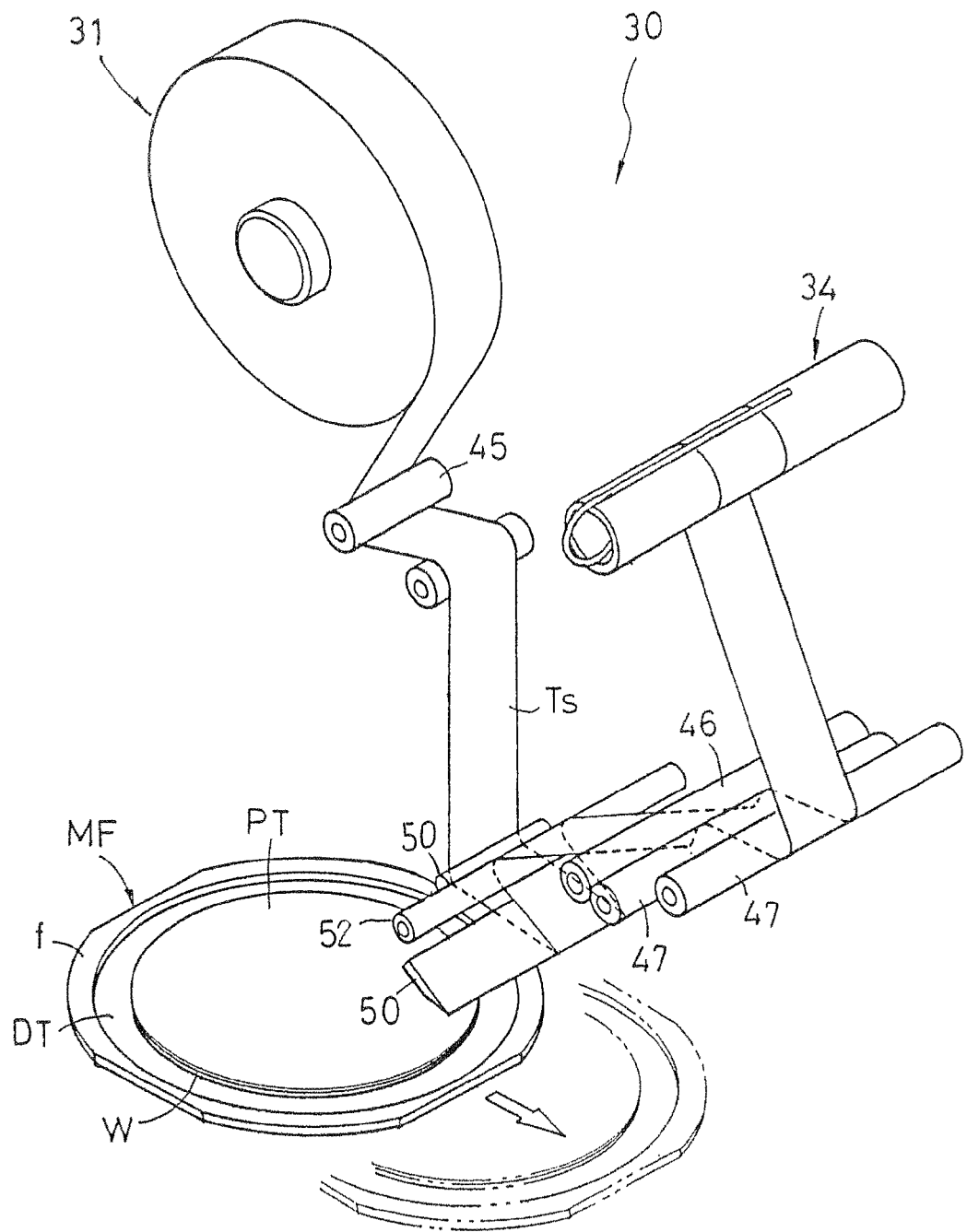
FIG. 5 is a perspective view illustrating the operation process of the separation mechanism.
Figure 6:
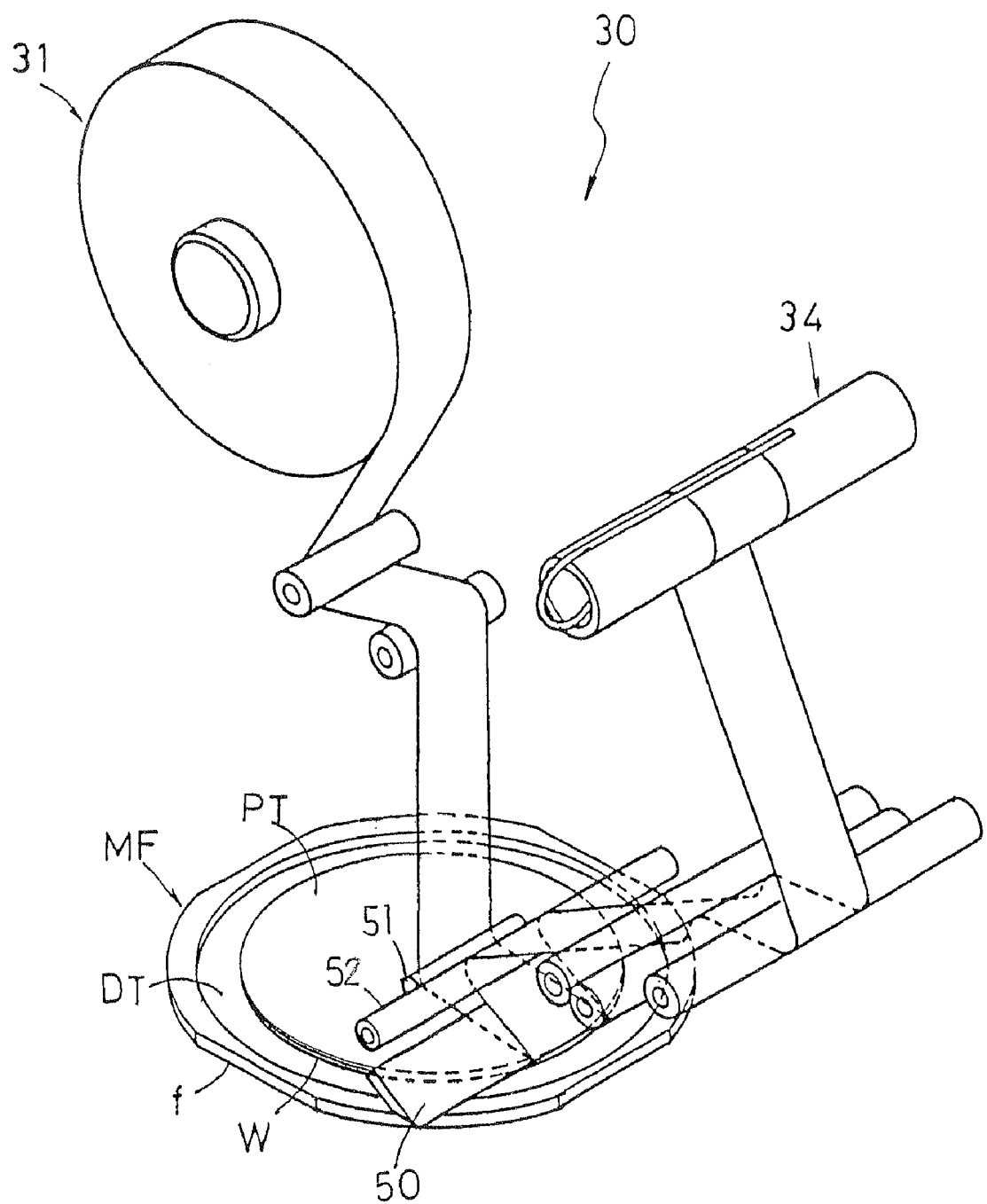
FIG. 6 is a perspective view illustrating the operation process of the separation mechanism.
Figure 7:
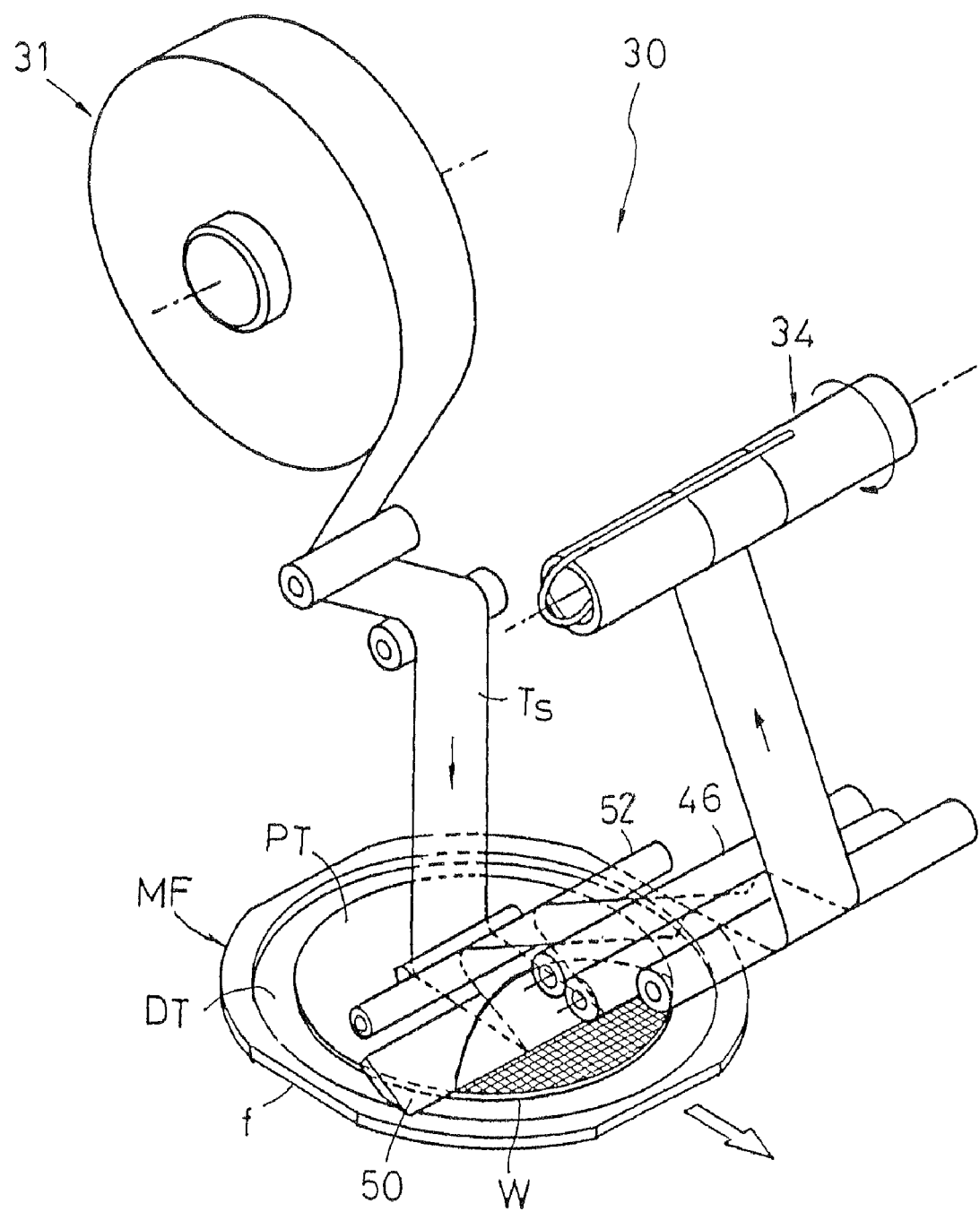
FIG. 7 is a perspective view illustrating the operation process of the separation mechanism.

As shown in FIG. 2, the separation mechanism 30 includes a separation table 38 on which the wafer W is mounted and which moves the wafer W, a tape supply part 31 for supplying the separation tape Ts, a separation unit 32 for joining and separating the separation tape Ts, and a tape collecting part 34 for collecting the separated separation tape Ts and the protective tape PT. The elements except for the separation table 38 in the separation mechanism 30 are provided in a fixed state in the semiconductor wafer mount apparatus 1.

The separation table 38 is configured to suck the mount frame MF from the back side by vacuum and is supported by a movable stand 42, which is supported so as to be slidable forward/backward along a pair of left and right rails arranged horizontally in the front and back direction. The movable stand 42 is screw fed and driven by a screw shaft 44 forward-reverse driven with a pulse motor 43. The movable stand 42, the pulse motor 43, and the screw shaft 44 serve as horizontal driving means of the present invention.

The tape supply part 31 guides and supplies the separation tape Ts led from the separation tape roller to the lower end of the separation unit 32 through the guide roller 45. The tape supply part 31 corresponds to separation tape supplying means of the present invention.

The collecting part 34 guides the separation tape Ts fed from the lower end of the separation unit 32 to the upper side through the motor driven feeding roller 46 and the guide roller 47, and then winds and collects the tape. The tape collecting part 34 corresponds to tape collecting means of the present invention.

The separation unit 32 is arranged with a movable block 48 which can be lifted, and a pulse motor 49 which screw feeds and lifts the movable block 48, where a joining member 50 for joining and separating the separation tape Ts to the protective tape PT, a receiving guide roller 51 for guiding the supplied separation tape Ts to the distal end of the joining member 50, and a feeding guide roller 52 for guiding the separation tape Ts turned back at the distal end of the joining member 50 towards the tape collecting part 34 are arranged at the lower end of the movable block 48. The joining member 50 is formed as an edge member having the distal end edge of a plate member having a width larger than the diameter of the wafer formed to a sharp tip, and is attached in an inclined orientation with the front side facing downward. The pulse motor 49 corresponds to first lifting driving means of the present invention.

The separation unit 32 includes a detection device 53 for detecting, in a non-contacting manner, the height to the object opposing on the lower side. The detection device 53 having a specification of projecting a laser light of a predetermined wavelength perpendicularly downward, receiving the reflected light thereof, and detecting the distance (height) to the light projected object is used. The detected information from the detection device 53 is transferred to a control device 54 for controlling the operations of the pulse motor 43 that moves the separation table 38 forward and backward, and the pulse motor 49 which lifts the joining member 50. The detection device 53 corresponds to a detector of the present invention, and the control device 54 corresponds to first and second controlling means of the present invention.

In the process of measuring the operation amount of the pulse motor 43 for moving the separation table 38 forward and backward with a rotary encoder and the like, the horizontal movement position of the separation table 38 is detected, and the detected information is also transferred to the control device 54.

As shown in FIG. 2, joining prevention member 55 is attached and fixed to a vertical wall of the semiconductor wafer mount apparatus 1 by way of an outer frame 61. Specifically, the joining prevention member 55 is arranged on the interior of an inner frame 63 screw fed and lifted by the forward-reverse drive of the motor 56 attached at the upper side of the outer frame 61.

A guide rail 64 arranged horizontally in the front and back direction is arranged on the front side (right side in the figure) in the horizontal direction of the inner frame 63. The joining prevention member 55 is fixed by screw to the movable stand 65 supported to be slidable forward/backward along the guide rail 64 by way of a holder. The movable stand 65 is screw fed and driven by a screw shaft 67 forward-reverse driven by a pulse motor 66. The pulse motor 66 and the screw shaft 67 correspond to second lifting driving means of the present invention.

Referring again to FIG. 1, the second mount frame transport mechanism 35 sucks by vacuum the mount frame MF pushed from the separation mechanism 30, and transfers it to the turn table 36.

The turn table 36 positions the mount frame MF and houses the mount frame MF into the mount frame collecting part 37. To be specific, when the mount frame MF is mounted on the turn table 36 by the second mount frame transport mechanism 35, the mount frame MF is positioned on the basis of the orientation flat of the wafer W, the positioning shape of the ring frame f, and the like. The turn table 36 is rotated to change the direction of housing the mount frame MF into the mount frame collecting part 37. When the housing direction is determined, the turn table 36 pushes the mount frame MF by a pusher (not shown) to house the mount frame MF into the mount frame collecting part 37.

The mount frame collecting part 37 is mounted on an lifting mount table (not shown). By the vertical movement of the mount table, the mount frame MF pushed by the pusher can be housed in an arbitrary stage in the mount frame collecting part 37.

A series of operations of the semiconductor wafer mount apparatus of this embodiment will now be described with reference to FIGS. 1 to 8.

The wafer holder of the robot arm 4 is inserted in the gap between the cassettes C. The wafer W is suction-held from below and pushed one by one. The pushed wafer W is transported to the alignment stage 7.

The wafer W is mounted on the holding table by the robot arm 4 and suction-held from the back side. At this point, the suction level of the wafer W is detected (actual measurement value) by a manometer (not shown), and the actual measurement value is compared with a reference value predetermined as a pressure value in normal operation.

When abnormality of suction is detected, the pressing plate 6 presses against the surface of the wafer W, and the wafer W is suction-held in a flat state obtained by correcting the warp. The wafer W is positioned on the basis of an orientation flat or a notch.

After completion of positioning on the alignment stage 7, the surface of the wafer W is irradiated with ultraviolet rays by the ultraviolet irradiation unit 14.

The wafer W subjected to the ultraviolet irradiating process is transported to the next mount frame fabrication part 27 while being suction-held by the holding table on the alignment stage 7. The alignment stage 7 moves to an intermediate position between the chuck table 15 and the ring frame lifting mechanism 26.

When the alignment stage 7 waits in a predetermined position, the chuck table 15 positioned above moves downward, the bottom face of the chuck table 15 comes into contact with the wafer W, and the chuck table 15 starts sucking the wafer W by vacuum. When the vacuum-suction of the chuck table 15 starts, the suction-holding on the holding table side is released, and the wafer W is received by the chuck table 15 in a flat state where the warp is corrected. The alignment stage 7 that has delivered the wafer W returns to the initial position.

The ring frames f housed in multiple stages in the ring frame supply part 16 are sucked by vacuum and ejected one by one from the top by the ring frame transport mechanism 17. The ejected ring frame f is positioned on an alignment stage (not shown) and, after that, is transported to the adhesive tape DT joining position above the adhesive tape DT.

When the ring frame f is held by the ring frame transport mechanism 17 and is in the adhesive tape DT joining position, supply of the adhesive tape DT from the tape supply part 19 starts. Simultaneously, the joining roller 22 moves to the joining start position.

When the joining roller 22 arrives at the joining start position, the tension mechanism 20 holds both ends in the width direction of the adhesive tape DT and applies tension in the tape width direction.

Next, the joining roller 22 moves upward to press the adhesive tape DT against the end of the ring frame f and join it. After joining the adhesive tape DT to the end of the ring frame f, the joining roller 22 rolls toward the tape supply part 19 side as the standby position. At this time, the joining roller 22 rolls while pushing the adhesive tape DT from the non-adhesion surface to thereby join the adhesive tape DT to the ring frame f. When the joining roller 22 reaches the terminating end of the joining position, holding of the adhesive tape DT by the tension mechanism 20 is released.

Simultaneously, the cutter mechanism 24 moves upward to cut the adhesive tape DT along the ring frame f. After completion of cutting of the adhesive tape DT, the separation unit 23 moves toward the tape supply part 19 side and separates the unnecessary adhesive tape DT.

After that, the tape supply part 19 operates to feed the adhesive tape DT and the unnecessary portion of the cut tape is sent to the tape collecting part 25. At this time, the joining roller 22 moves to the joining start position so as to join the adhesive tape DT to the next ring frame f.

The frame portion of the ring frame f to which the adhesive tape DT is joined is suction-held by the ring frame lifting mechanism 26 and is moved upward. At this time, the chuck table 15 also moves downward. That is, the chuck table 15 and the ring frame lifting mechanism 26 move to the position where the wafer W is joined.

The mechanisms 15 and 26 arrive at predetermined positions and are held by holding mechanisms (not shown). Next, the joining roller 28 moves to the joining start position of the adhesive tape DT, and rolls while pressing the non-adhesion surface of the adhesive tape DT joined to the bottom face of the ring frame f, thereby joining the adhesive tape DT to the wafer W. As a result, the mount frame MF obtained by integrating the ring frame f and the wafer W is fabricated.

Figure 15:
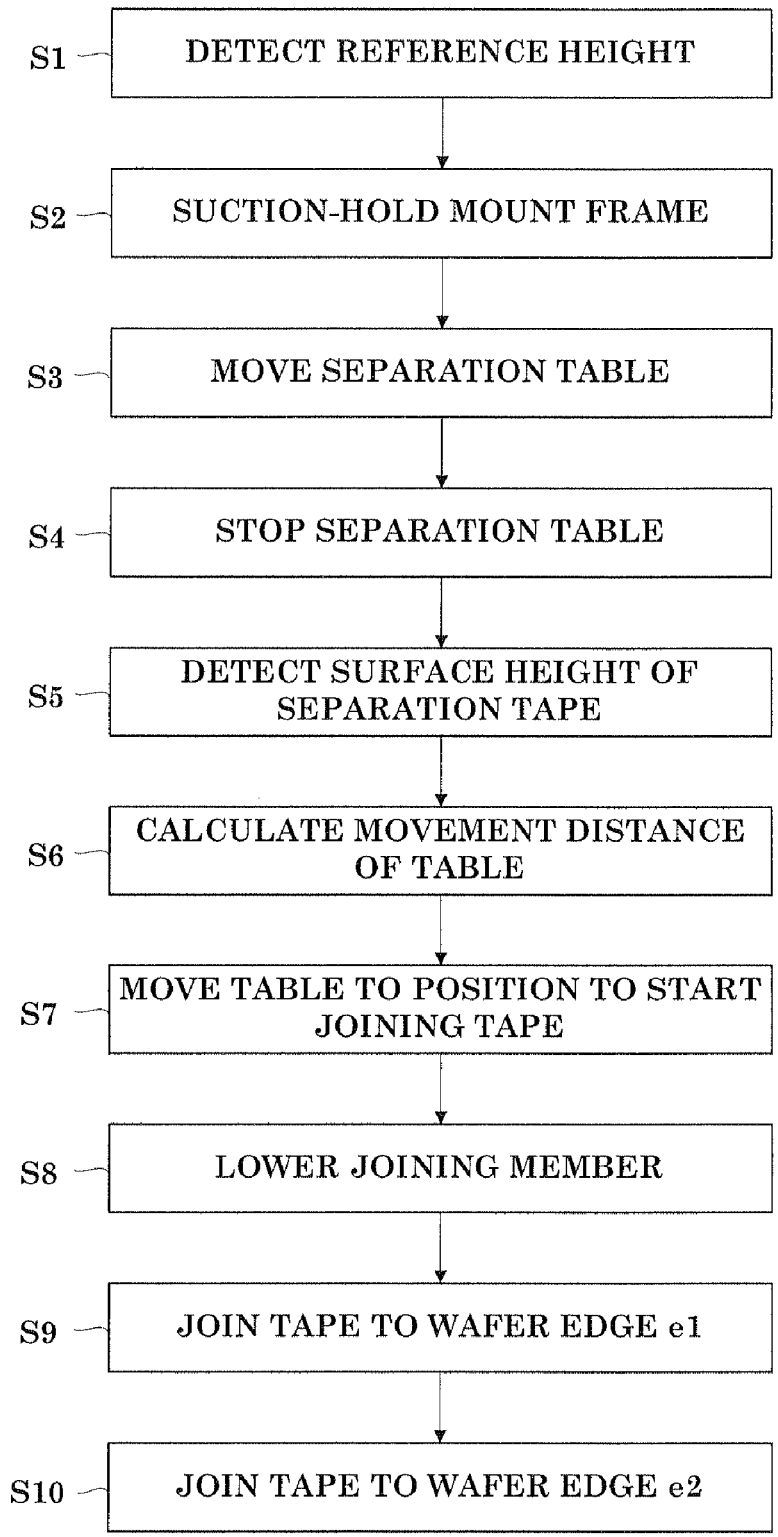
FIG. 15 is a flowchart of a process of separating the protective tape.

After the mount frame MF is fabricated, the chuck table 15 and the ring frame lifting mechanism 26 move upward. At this time, a holding table (not shown) moves to a position below the mount frame MF, and the mount frame MF is mounted on the holding table. The mounted mount frame MF is suction-held by the first mount frame transport mechanism 29 and moved to mount onto the separation table 38, and is then subjected to a protective tape separation process according to the procedures shown in the flowchart of FIG. 15.

In other words, prior to mounting the mount frame MF on the separation table 38, the detection device 53 is operated and the height from the separation table 38 to the detection device 53 is detected. The detection result is retrieved into the control device 54 as a reference height (step S1). Thereafter, the mount frame MF is moved and mounted on the separation table 38, and then suction-held (step S2).

The separation table 38 is then moved forward (step S3). First, when the adhesive tape DT arrives at the detecting position (light projecting position) by the detection device 53, the movement of the separation table is stopped (step S4), as shown in FIG. 2. At this point, the surface height of the adhesive tape DT is detected by the detection device 53. The detected information is transferred to the control device 54, and control device 54 then calculates an origin with respect to the height before lowering of the joining member 50 (step S5). At the same time, the control device 54 calculates the lowering operation amount of the joining prevention member 55.

The separation table 38 is then moved forward, and the detecting operation by the detection device 53, and the detection of the movement position of the separation table 38 are performed. The count time and the height at which the detected value of the detection device 53 rapidly changed, and the position of the separation table 38 at the relevant count time are stored in the control device 54 as positions of wafer edges e1, e2 at both ends (step S6).

A plurality of height detected values in a predetermined range (e.g., 1 to 20 mm) from the wafer edge e1, which is the side to start joining of the separation tape, are averaged by the calculation with the control device 54 and the resultant average is assumed as the surface height of the protective tape PT. The lowering operation amount of the joining member 50 is determined based on this value. The lowering operation amount is calculated based on the surface height of the protective tape PT acquired through averaging using the height of the joining member 50 at the origin position set in advance, the thickness of the separation tape Ts wound around the joining member 50, and the like. The lowering operation amount for contacting the separation tape Ts to the surface of the protective tape PT with a predetermined pressing force by lowering the joining member 50 is determined in such a manner. The control device 54 has a function serving as calculating means of the present invention.

Figure 8:
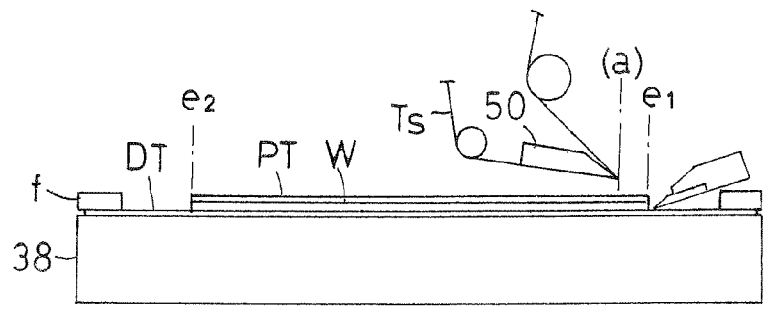
FIG. 8 is a side view illustrating the operation process of the separation mechanism.

The separation table 38 is moved backward, and the movement of the table is stopped when the distal end of the joining member 50 has arrived at a position (a) closer to the center of the wafer by a set amount from the wafer edge e1 on the side to start joining of the separation tape, as shown in FIG. 8 (step S7).

Figure 9:
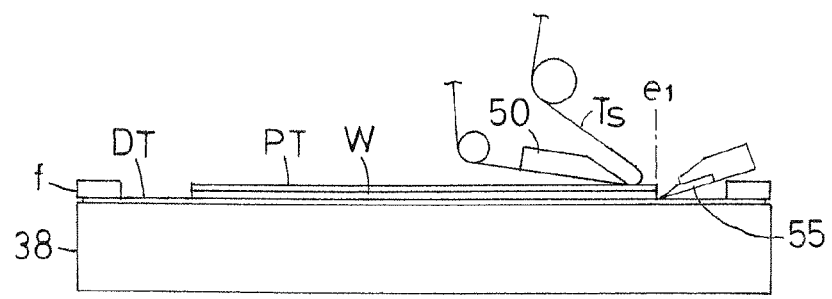
FIG. 9 is a side view illustrating the operation process of the separation mechanism.

As shown in FIG. 9, the joining member 50 at the origin height position is controlled to be lowered by the calculated and determined lowering operation amount, and then stopped. The separation tape Ts is thereby contacted to the surface of the protective tape PT with a predetermined pressing force (step S8).

Figure 10:
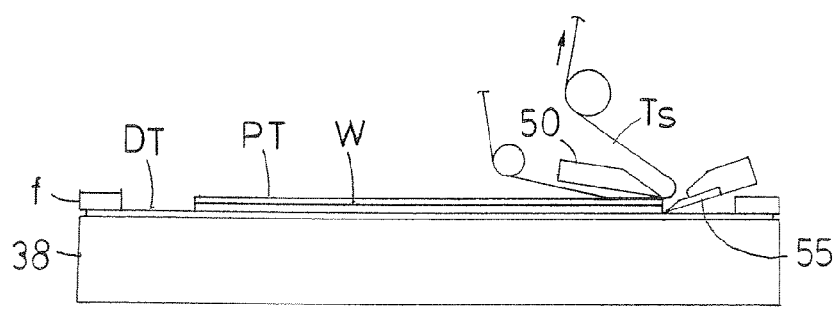
FIG. 10 is a side view illustrating the operation process of the separation mechanism.

When the separation tape Ts is contacted to the surface of the protective tape PT, the separation table 38 is further moved backward while maintaining the height of the joining member 50, as shown in FIG. 10, and the separation tape Ts is joined to the surface of the protective tape PT up to the wafer edge e1 (step S9).

Figure 14:
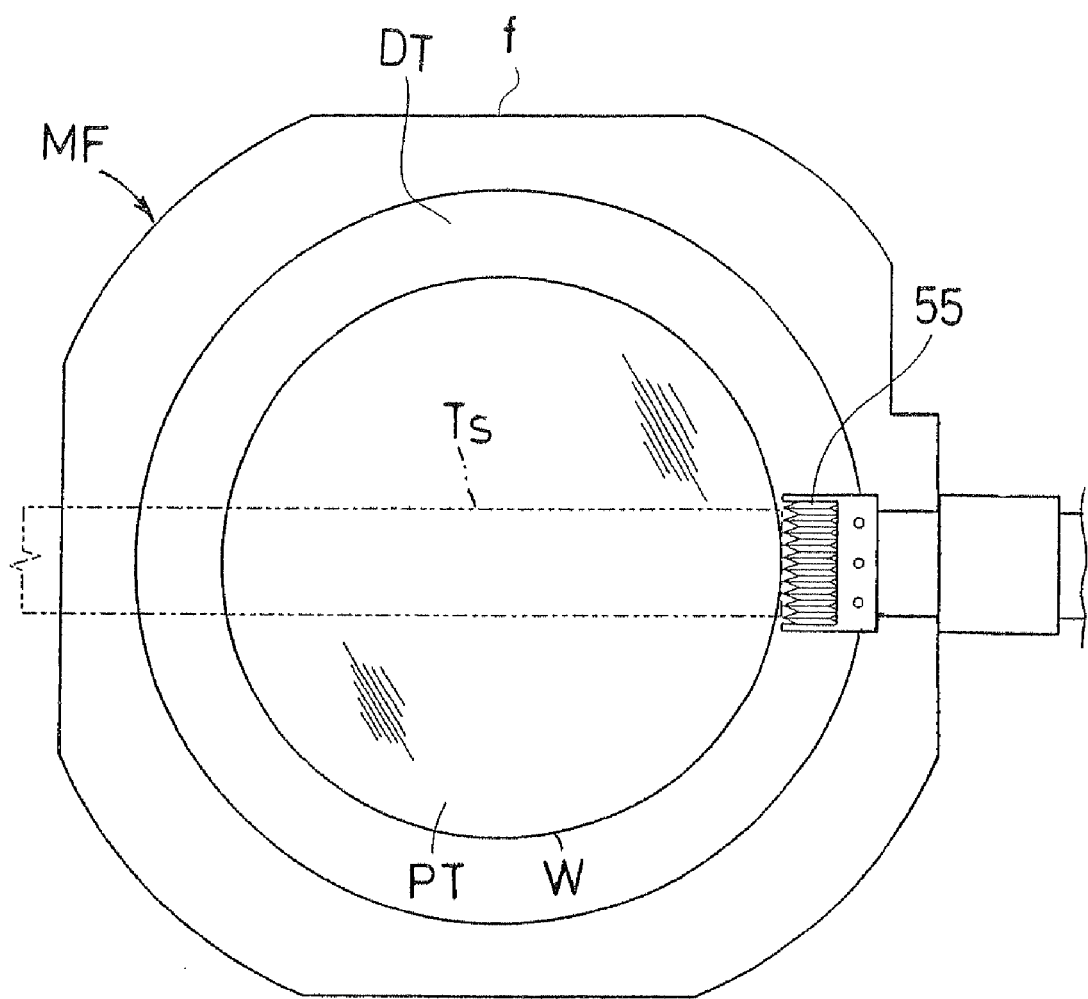
FIG. 14 is a plan view of a joining prevention member.

In this case, the joining prevention member 55 is advanced into a standby position at the outer side of the wafer edge e1. As shown in FIG. 14, the joining prevention member 55 has a width slightly larger than the separation tape Ts and is configured with a plate-shaped member in which the upper surface is formed on the difficult-to-adhere surface with vertical lines, the separation tape Ts running out from the distal end of the joining member 50 hangs downward, and is prevented from joining to the adhesive tape DT. The joining prevention member 55 has the distal end close to the wafer edge e1 and the bottom surface arranged at a proximate position of the adhesive tape DT based on the surface height (origin position) of the adhesive tape DT detected by the detection device 53 and the position of the wafer edge e1.

Figure 11:
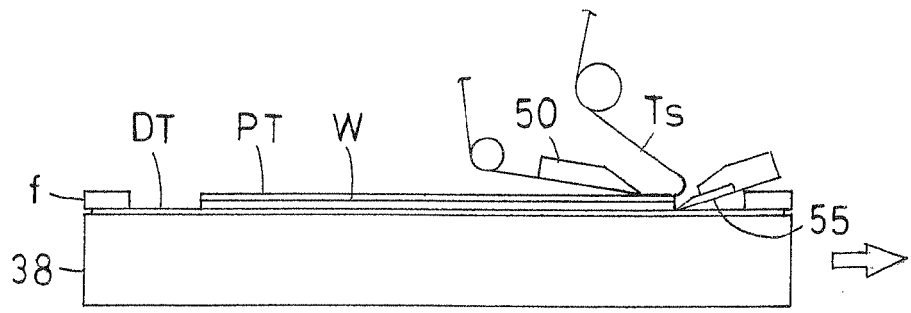
FIG. 11 is a side view illustrating the operation process of the separation mechanism.
Figure 12:
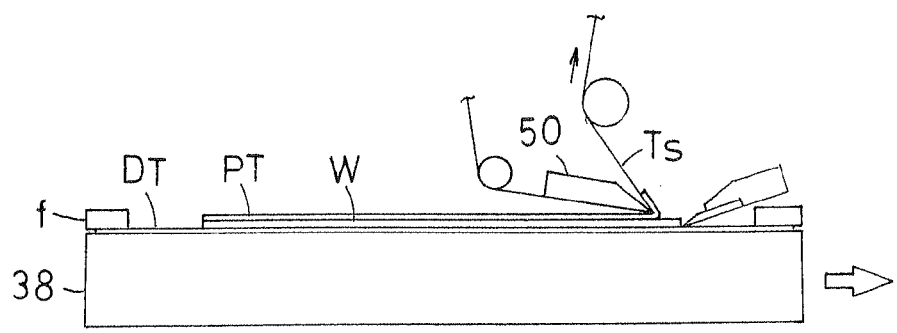
FIG. 12 is a side view illustrating the operation process of the separation mechanism.
Figure 13:
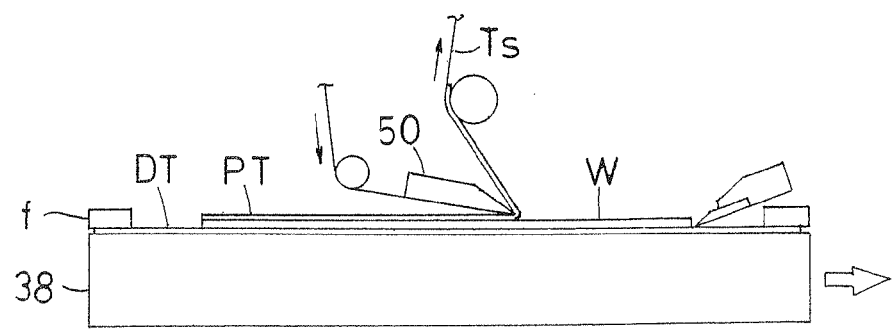
FIG. 13 is a side view illustrating the operation process of the separation mechanism.

When joining of the separation tape Ts to the end of the protective tape PT is completed, the separation table 38 again starts to be moved forward while maintaining the height of the joining member 50 and the separation tape Ts is wound towards the tape collecting tape 34 at a speed tuned with the movement speed, as shown in FIG. 11 to FIG. 13 (step S10).

Thus, the joining member 50 is joined while pressing the separation tape Ts against the protective tape PT of the surface of the wafer W, and at the same time, the protective tape PT is separated from the surface of the wafer W integrally with the separation tape Ts while separating the joined separation tape Ts.

At the time when the joining member 50 arrives at the wafer edge e2 on the side to terminate joining of the separation tape, that is, at the time when the joining member 50 arrives at the rear end edge of the protective tape PT and the protective tape PT is completely separated from the surface of the wafer, the joining member 50 is controlled to move upward, and the control device 54 returns to the initial state.

The mount frame MF subjected to the process of separating the protective tape PT is moved to the standby position of the second mount frame transport mechanism 35 by the separation table 38.

The mount frame MF ejected from the separation mechanism 30 is moved to mount onto the turn table 36 by the second mount frame transport mechanism 35. The transferred mount frame MF is positioned on the basis of the orientation flat or notch, and its housing direction is adjusted. After completion of the positioning and adjustment of the housing direction, the mount frame MF is pushed by the pusher and housed into the mount frame collecting part 37.

Therefore, the variation in the thickness of the protective tape PT and the adhesive tape DT is corrected by detecting the surface height of the protective tape PT, and calculating the lowering operation amount of the joining member 50 using the relevant detected information. The excessive load is thus not applied on the wafer W when joining the separation tape by controlling the height of the joining member 50 based on the calculation result. Consequently, damages to the wafer W can be avoided.

The present invention can also be implemented in the following aspects.

(1) In the above-described embodiment, the average value of the surface height of the protective tape PT is calculated in a predetermined range of the wafer edge portion, and the operating position of the joining member 50 is maintained using the height in the subsequent process of joining the separation tape Ts, but the separation tape Ts may be joined in the following aspects.

As a first aspect, the average value in a predetermined range of the wafer edge portion is obtained as below. The distribution of the detected values is obtained, and the average value is obtained excluding the unique values from the distribution. The unique values include those from concave parts caused by deficit etc. of the protective tape PT, hanging of the protective tape PT at the wafer edge, raised portions due to chipping of the protective tape PT, floating due to failure in tape adherence, attachment of foreign substances, and the like. According to this aspect, the average value does not increase nor decrease by unique values. In other words, the value is approximated to the original surface height of the protective tape PT, and thus the lowering operation amount of the joining member 50 stabilizes. Therefore, excessive load is not applied on the wafer W at the operating position of the joining member 50, and the pressing force does not lower. Therefore, damages to the wafer W can be avoided, and adherence failure of the separation tape Ts can be avoided.

As a second aspect, the total thickness from the adhesive tape DT to the protective tape PT and the thickness of the adhesive tape DT are obtained beforehand through experiments and simulations as a reference value from the mount frame F created in advance using the ring frame f, the adhesive tape DT, the wafer W, and the protective tape PT, and then stored in the control device 54. In the actual process, the control device 54 compares the actual measurement value of the surface height of the protective tape PT obtained from the actual measurement and the reference value read out from the storage part, and corrects the lowering operation amount of the joining member 50 from the obtained deviation. Therefore, the load applied on the wafer W when joining the separation tape Ts is maintained constant.

The control device 54 also compares the actual measurement value of the adhesive tape DT measured in the actual process and the reference value, and calculates the lowering operation amount of the joining prevention member 55 according to the obtained deviation. The joining prevention member 55 is then avoided from contacting the adhesive tape DT.

As a third aspect, the surface heights to the wafer edges e1 to e2 are continuously detected by the detection device 53 and the detected information and the detected position information are stored in association to each other. The lowering operation amount of the joining member 50 is calculated with respect to all the stored detected information. When joining the separation tape Ts, the lowering operation amount of the joining member 50 is changed according to the tape joining position with reference to the calculated lowering operation amount. The load applied by the joining member 50 on the surface of the wafer is thereby maintained constant.

Alternatively, the first to the third aspects may be combined.

(2) The above-described embodiment is also applicable to a case of joining the separation tape Ts to the wafer W with a protective tape not held by the ring frame f and then separating the protective tape PT. In this case, the control device 54 controls the height and the position of the joining prevention member 55 so that the play end of the separation tape does not contact the separation table 38 when joining the separation tape Ts. For instance, the control device 54 calculates the lowering position and the lowering operation amount so that the distal end of the joining prevention member 55 is proximate to the wafer edge e1 and is positioned at the height of contacting or being close to the surface of the separation table 38.

(3) In the above-described embodiment, after the separation tape Ts is joined to the wafer edge e1, the separation tape Ts may be joined in one direction up to the wafer edge e2 on the other end.

(4) In the above-described embodiment, the joining and the separation of the separation tape Ts to the protective tape PT are simultaneously carried out by the joining member 50 while the mount frame MF is moved forward and passed below the separation unit 32, but the joining and the separation of the separation tape Ts to the protective tape PT may be sequentially performed in separate processes.

(5) In the above-described embodiment, the edge member is used as the joining member 50 of the separation tape Ts, but a roller may be used. In this case, the circumferential surface of the roller is preferably hard, and the roller diameter is preferably made as small as possible.

(6) In addition to a device using the laser light as described above, the device of detecting by analyzing a photographed image acquired with a CCD camera and the like may be arbitrarily selected and used for the detection device 53 of detecting the height of the protective tape PT in a non-contacting manner.

(7) In the above-described main embodiment, the mount frame MF may be fixed, and the separation unit 32 may be horizontally moved.

(8) In the above-described embodiment, the separation tape Ts is joined to the protective tape PT by operation controlling the joining member 50 to lower, but the separation table 38 may be lifting operated with respect to the joining member 50 which does not lifting operate. In this case, the raising operation amount of the separation table 38 is calculated and determined based on the detected information of the surface height of the protective tape PT.

(9) In the above-described embodiment, a rolled band-shaped tape is fed and used for the separation tape Ts of separating the protective tape PT, but a sheet of an adhesive tape or an adhesive sheet cut with a predetermined dimension may be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. A protective tape separation method for separating a protective tape from a surface of a semiconductor wafer integrally with a separation tape by joining the separation tape to the protective tape joined to the surface of the semiconductor wafer while pressing a non-adhesion surface side by a joining member and separating the separation tape, the method comprising:
   a detecting step of detecting a separation tape joining start position and a surface height of the protective tape joined to the semiconductor wafer mounted and held on a separation table;
   a calculating step of calculating an operation amount of approaching the joining member to the protective tape until the separation tape wound around the joining member contacts the protective tape based on the detected information of the surface height of the protective tape;
   a separation tape joining start step of controlling the operation to approach the joining member to the protective tape based on the calculated operation amount, and joining the separation tape to the protective tape;
   a separation tape joining step of relatively moving the joining member and the separation table along a direction of a surface of the protective tape while maintaining the height of the joining member based on the operation amount and joining the separation tape to the protective tape; and
   a tape separating step of separating the separation tape from the surface of the semiconductor wafer integrally with the protective tape,
   wherein the calculating step has an average value of a plurality of detected values as the surface height of the protective tape, the plurality of the detected values being obtained in the detecting step in a predetermined range including a wafer edge on a side to start joining of the separation tape of the semiconductor wafer, and
   wherein prior to joining of the separation tape on the protective tape, the protective tape surface height is continually measured along the diameter of the wafer, and the height of the joining member is appropriately changed in accordance with detected information in the separation tape joining step.

2. The protective tape separation method according to claim 1, wherein the average value obtained in the calculating step is obtained by measuring a distribution of the surface height from the detected value, and excluding a unique value from the distribution.

3. The protective tape separation method according to claim 1, wherein
   a deviation between a reference value of the surface height of the protective tape determined in advance and an actual measurement value of the surface height of the protective tape obtained from an actual measurement is obtained, and
   the operation amount obtained in the calculating step is corrected according to the deviation.

4. The protective tape separation method according to claim 1, wherein the separation tape is joined to an end of the protective tape on the side to start joining of the separation tape, and the separation tape is joined from the end towards a side to terminate joining of the separation tape.

5. The protective tape separation method according to claim 1, wherein
   the joining member is operated to approach the surface of the protective tape closer to a center of the wafer with respect to the wafer edge on the side to start joining of the separation tape, and join the separation tape towards the wafer edge on the side to start joining of the separation tape while maintaining a height of the joining member; and
   the separation tape is joined towards a wafer edge on a side to terminate joining of the separation tape while maintaining the height of the joining member.

6. The protective tape separation method according to claim 1, further comprising a step of arranging a joining prevention member having a difficult-to-adhere property for receiving the separation tape running out from the wafer edge on an outer side of the wafer edge on the side to start joining of the separation tape before the step of starting joining of the separation tape.

7. The protective tape separation method according to claim 6, further comprising the steps of:
   detecting a position of the wafer edge and a height of an outer peripheral portion of the wafer edge;
   calculating an operation amount of approaching a distal end of the joining prevention member to the surface height of the wafer edge and the outer peripheral portion of the wafer edge based on the detected information; and
   moving the joining prevention member to a position corresponding to the calculated operation amount before the step of starting joining of the separation tape.

8. The protective separation method according to claim 7, wherein
   the semiconductor wafer is held at a center of a ring frame by way of a supporting adhesive tape;
   a surface of the adhesive tape exposed between the ring frame and the semiconductor wafer is detected in the detecting step;
   an operation amount of approaching the joining prevention member to the adhesive tape is calculated based on the detected information in the calculating step; and
   a step of approaching the joining prevention member to the adhesive tape is provided before the step of starting joining of the separation tape.

9. The protective tape separation method according to claim 1, wherein the step of joining the separation tape and the step of separating the tape are simultaneously carried out.

* * * * *